United States Patent [19]

Nishigaki et al.

[11] Patent Number: 4,795,670
[45] Date of Patent: Jan. 3, 1989

[54] MULTILAYER CERAMIC SUBSTRATE WITH CIRCUIT PATTERNS

[75] Inventors: Susumu Nishigaki; Junzo Fukuda; Shinsuke Yano; Hiroshi Kawabe, all of Nagoya, Japan

[73] Assignee: Narumi China Corporation, Nagoya, Japan

[21] Appl. No.: 47,746

[22] Filed: May 8, 1987

[30] Foreign Application Priority Data

May 14, 1986 [JP] Japan .................. 61-108627

[51] Int. Cl.⁴ .................. B32B 7/00; H05K 1/00
[52] U.S. Cl. .................. 428/209; 428/210; 428/432; 428/617; 428/618; 428/673; 428/901; 174/68.5; 361/414
[58] Field of Search ........... 428/209, 210, 432, 901, 428/671, 672, 673, 617, 618, 669; 361/414; 427/96, 97, 98

[56] References Cited

U.S. PATENT DOCUMENTS

| | | | |
|---|---|---|---|
| 3,031,344 | 4/1963 | Sher et al. | 428/669 |
| 4,299,873 | 11/1981 | Ogihara et al. | 428/210 |
| 4,313,026 | 1/1986 | Yamada et al. | 361/414 |
| 4,328,531 | 5/1982 | Nagashima et al. | 361/414 |
| 4,459,166 | 7/1984 | Dietz et al. | 428/209 |
| 4,465,742 | 8/1984 | Nagashima et al. | 428/901 |
| 4,620,264 | 10/1986 | Ushifusa et al. | 428/209 |
| 4,650,923 | 3/1987 | Nishigaki et al. | 361/414 |
| 4,663,215 | 5/1987 | Dubuisson et al. | 428/209 |
| 4,665,468 | 5/1987 | Dohya | 361/414 |
| 4,672,152 | 6/1987 | Shinohara et al. | 361/414 |
| 4,675,788 | 6/1987 | Breitling et al. | 361/414 |
| 4,732,798 | 3/1988 | Ishida et al. | 428/901 |

FOREIGN PATENT DOCUMENTS

0107596  6/1984  Japan .................. 428/209

Primary Examiner—Ellis P. Robinson
Assistant Examiner—Donald J. Loney
Attorney, Agent, or Firm—Flynn, Thiel, Boutell & Tanis

[57] ABSTRACT

A multilayer ceramic substrate with multilayered circuit patterns, the improvement in which internal conductors for wiring are formed by a Ag base conductive materials capable of being co-fired with multilayered green ceramic substrate sheets in an oxidizing atmosphere and external conductors electrically connected with the internal conductors are formed by a Cu base conductive material, the external Cu conductors being formed in such a manner so that a liquid phase of Cu-Ag is not formed at the interface of the Cu conductor and the Ag conductor. Further high reliable resistors of $RuO_2$ or $Bi_2Ru_2O_7$ type may be integrally formed onto and/or inside the substrate. In such an arrangement, problems or difficulties caused due to Ag migration, incomplete binder removal, solder leaching, etc., are eliminated and thereby there can be a multilayer substrate with a high reliability and a high pattern precision.

14 Claims, 5 Drawing Sheets

MULTILAYER CERAMIC SUBSTRATE WITH CIRCUIT PATTERNS

BACKGROUND OF THE INVENTION

1. [Field of the Invention]

The present invention relates to a multilayer ceramic substrate containing interconnected circuit patterns which is used in an electronic industry, such as in the manufacture of electronic devices or articles for domestic use or computers, etc.

More specifically, the present invention relates to a low-temperature fired multilayer ceramic substrate with interlayered silver conductors and copper external conductors.

2. [Description of the Prior Art]

Heretofore, circuit substrates using ceramics as an insulator have been used in various electronic devices or equipments.

As typical examples, there have been known co-fired type multilayer ceramic substrates using tungusten (W) or molybdenum (Mo) as conductors for wiring in which the substrates have been co-fired with the W or Mo conductors in a reducing atmosphere in order to prevent oxidation of these conductors. However, such conventional substrates are disadvantageous in the following aspects due to the use of the W or Mo conductors.

(1) High conductor resistivity of 10 to 20 milliohms/square.
(2) Au plating is needed for obtain solderability.
(3) Conductors are subjected to oxidation when highly reliable resistors of $RuO_2$ type or $Bi_2Ru_2O_7$ type which need to be fired in an oxidizing atmosphere are formed.

In recent years, there have been developed cofireable multilayer ceramic substrates using Ag base conductors, such as Ag, Ag-Pd, Ag-Pt, or Ag-Pd-Pt, which conductors have a low conductor resistivity and are firable in an oxidizing atmosphere together with a ceramic material as an insulator which can be fired at temperatures below the melting points of the conductive materials.

Copper base conductors have been also known and the conductors are most suitable as external conductors because of their advantages of low conductor resistivity of the order of 1.5 to 3 milliohms/square, good anti-migration property and high solder-leach resistance.

When an Ag base conductive material is used as the conductors in the aforesaid multilayer ceramic substrate, a metal component, such as Ag, etc., in the conductors formed on the external surface of the multilayer substrate tends to migrate and thereby serious problems, such as decrease of insulation resistance or short circuit, may be caused. Further, the Ag conductors do not have a sufficient solder-leach resistance. As a measure of preventing such a migration of Ag, etc., for example, in Ag-Pd system conductors, palladium content is increased. However, in such a case, the conductor resistivity will be increased to an unfavorable levels, for example, the orders of 20 to 30 milliohms/square and difficulties have been experienced in obtaining Ag external conductors having well-balanced properties in all the aspects of the properties of conductor resistivity, migration resistance and solder-leach resistance, from Ag conductive materials.

On the other hand, when Cu is used as conductors in the multilayer ceramic substrate, firing is carried out at relatively low temperature of the order of 800° to 1100° C. and a neutral atmosphere or a reducing atmosphere is employed in order to prevent the oxidation of copper. In such firing conditions, an organic binder employed to make ceramic insulator materials or other powdered materials castable can not be fully burned off and residues of the resin binder component remain as carbon, thereby causing a serious decrease of insulation resistance. Therefore, a very prolonged binder removal procedure is necessary and this is undesirable for practical use. $RuO_2$ type or $Bi_2Ru_2O_7$ type resistors which have been known as highly reliable resistors can not be employed with the Cu conductors. The reason for this is that these resistors should be fired in an oxidizing atmosphere, while such an atmosphere causes oxidation of Cu.

SUMMARY OF THE INVENTION

An object of the present invention is to provide a multilayer ceramic substrate with circuit patterns with a view to eliminating the foregoing problems experienced in the prior art.

The present invention is directed to a multilayer ceramic substrate with circuit patterns in which internal conductors for wiring are formed by an Ag base conductive material to be fired in an oxidizing atmosphere and external conductors electrically connected with the internal conductors are formed by a Cu base conductive material, the external Cu conductors being formed in such a way that a liquid phase of Cu-Ag is not formed at the interface of the Cu conductor and the Ag conductor. In such an arrangement of the present invention, Cu conductors which have a low resistance and are excellent in anti-migration property and solder-leach resistance are used on the surface of the substrate and Ag conductors are used inside the substrate.

In the fabrication of the foregoing multilayer ceramic substrate of the present invention, green sheets of a ceramic insulator material having Ag base conductors therein are laminated together in a multilayer form and then are simultaneously fired in an oxidizing atmosphere. Onto the surface of the resulting fired body, a conductor pattern made of Cu conductive material is formed in such a manner that the Cu conductor pattern is electrically interconnected with internal Ag conductors and then fired in a neutral or reducing atmosphere.

In accordance to one preferred embodiment of the present invention, the Cu conductor is formed by firing at temperatures below the eutectic melting point of the Cu conductor and the Ag conductor, thereby preventing formation of the Cu-Ag liquid phase at the interface of the two different kinds of conductors.

In a further embodiment, a metallic layer different from the Cu conductors and the Ag conductors is interposed between these two kinds of conductors for the same purpose.

In a still further embodiment, the Cu conductors are formed by a plating process.

The present invention will be now explained below in detail by referring to the accompanying drawings. Throughout this specification, "Ag conductor" or "Cu conductor" are used in a common sense in the art and may further contain conductive materials, such as Pd and/or Pt, in addition to the main component of Ag or Cu.

DETAILED DESCRIPTION OF THE PREFERRED EMBODIMENTS

Ceramic materials which are fireable at temperatures lower than the melting point of an Ag conductive material layered inside the multilayer substrate can be used as the ceramic insulator material. For instance, when Ag or Ag base alloy containing Pd or Pt in a small content is used as the conductive material, it is requested that the ceramic insulator material be fireable at temperatures ranging from 800° to 1100° C., since these interlayered conductive metals have relative low melting points of about 900° to 1200° C. Typical examples of such low-temperature fireable ceramic insulator materials include the following materials.

(1) Mixture of glass powder and ceramic powder, the glass powder being borosilicate glass powder or borosilicate glass powder containing several kinds of oxides (e.g., oxides of alkali metal or alkaline earth metal; or PbO, ZnO, $Al_2O_3$ MnO, $Cr_2O_3$) and the ceramic powder being alumina, quartz, chromium oxide, mullite, cordierite, etc. In the firing process of the mixture, the glass component may be crystallized or create a certain crystallized product due to the reaction with the ceramic powder.

(2) Crystallizable glass powder which provides crystallites of cordierite, alpha-spodumene, celsian, anorthite, wollastonite, etc.

(3) Glass-free insulator material composed of alkali metal oxide, alkaline earth metal oxide, $SiO_2$ and other oxide additives, such as $B_2O_3$, $Al_2O_3$, $Cr_2O_3$, ZnO, $ZrO_2$. In the provision of such a material, thermally decomposable compounds (e.g., CaO or $CaCO_3$) may be used as starting materials and, in this case, these compounds are mixed and calcined to form the foregoing material.

In the fabrication of a multilayer substrate structure using the materials as set forth above, a green sheet laminating process or a green sheet printing process can be employed.

When the green sheet laminating process is employed, a slurry consisting of ceramic insulator material powder and vehicle is cast into a green sheet with a thickness of 0.1 to 0.5 mm by a doctor blading technique. A desired conductor pattern is screen-printed onto the surface of the green ceramic sheet, using Ag, Ag-Pd, Ag-Pt, Ag-Pd-Pt or similar Ag base conductive pastes. For electrical interconnection with the conductor layers to be printed onto other green sheets, through holes having a diameter of the order of 0.2 to 0.5 mm are formed in the green sheet, using a die or a punching tool, and then filled with a conductive material. Similarly, conductor patterns required for the intended circuit are printed onto other green ceramic sheets. The green ceramic sheets thus obtained are laminated together and then hot-pressed at a temperature of 80° to 150° C. and at a pressure of 50 to 250 kg/cm² to form a monolithic body.

When resistors are desired to be contained in the circuit, $RuO_2$ or $Bi_2Ru_2O_7$ type resistors, which need to be fired in an oxidizing atmosphere, are formed. In this case, these resistors are printed onto the external green sheet or the inner green sheet together with electrodes therefor.

The green ceramic body thus laminated is co-fired in an oxidizing atmosphere to provide a multilayer ceramic substrate containing conductors therein. If necessary, $RuO_2$ or $Bi_2Ru_2O_7$ type resistors and an overcoat layer are formed by a printing technique and fired in an oxidizing atmosphere.

When the multilayer substrate is fabricated by a green sheet printing process, a base green ceramic sheet, 0.3 to 2.0 mm in thickness, is obtained in the same way as in the green sheet laminating process, as previously described. Onto this green sheet, a ceramic insulator paste having the same composition as that of the green sheet and the foregoing Ag base conductive paste are alternately printed to form multilayered conductor patterns. Interconnection between the conductor layers is achieved through via holes having a diameter of the order of 0.2 to 0.5 mm. When it is desired to form resistors by co-firing with the substrate, the resistors are printed with their electrodes onto and/or inside the substrate and cofired. Further, if desired, resistors and a overcoat layer are printed and fired in an oxidizing atmosphere.

The Cu conductors are formed by screen-printing a Cu base conductive paste in a desired conductor pattern onto the foregoing multilayer ceramic substrate with the circuit patterns and then firing in a neutral atmosphere or a reducing atmosphere.

The firing of the Cu conductors is carried out at firing temperatures of 500° to 1000° C. When the firing temperature is higher than the eutectic melting point of the Cu conductor and the internal Ag conductor, a liquid phase will form at the interface between these conductors during firing and the Ag component precipitates on the surface of the Cu conductors, thereby impairing the anti-migration properties. Further, blisters and bubbles are formed and the reliability is seriously deteriorated. For such reasons, the firing temperature of the Cu base conductive material should be adjusted below the eutectic melting point thereof with the Ag conductors. In order to make possible the formation of the Cu conductor at such a low firing temperature, fine powder of Cu having an average particle size of 0.1 to 1.0 μm with a narrow particles size range or Cu powder having a broad particle size range of 0.1 to 10 μm is employed in the Cu base conductive materials.

In most of Cu base conductive materials, preferable firing temperatures are in the range of 850° to 950° C. and this firing range is generally higher than the aforesaid eutectic melting point. Therefore, in the particular case where a high reliability is required for the interface of the Ag conductor and the Cu conductor, a different metal layer is interposed between these two types of conductors. The metal layer employed for this purpose is made of metal which does not form any liquid phase with the aforesaid Ag and Cu conductors at the firing temperature of the Cu conductors, i.e., from 850° to 950° C., and examples of such a metal are Ni, Cr, Ti, Pd, etc. The metal layer is formed by plating, evaporating, sputtering or ordinary thick film techniques including a firing step.

When much higher levels of fineness and density are required in the resulting external conductor pattern, a plating process as set forth hereinunder is employed and this is one aspect of the present invention. In the formation of this external conductor pattern, firstly, Cu conductors are deposited onto the surface of the foregoing multilayer ceramic substrate containing the internal Ag type conductors, by electroless plating. Thereafter, a desired conductor pattern having desired thickness and line width are provided by electro-plating and photolithography techniques. In conventional thick film techniques, the finest fired patterns have been limited to the order of 100 to 200 $\mu$m in line width and space between lines. In contrast to this, such a plating process of this present invention permits finer and higher density patterns on the order of several tens of microns both in line width and spacing between lines. If necessary, Ni may be deposited onto the Cu coating by plating to obtain an improved solder-leach resistance and, further, Cu or Au plating may be conducted onto the Ni coating to prevent oxidation of Ni and improve solderability. When the external conductors are formed by such a plating process, there is no risk that the foregoing liquid phase is formed at the interface between the internal Ag conductors and the external Cu conductors during the plating procedure, since the external conductors are not subjected to high temperature exposure.

In conventional multilayer alumina ceramic substrate using W on Mo as conductors, the foregoing plating process can not be employed, since the conductors are corroded at their exposed portions by attack of strong alkaline or strong acidic solution employed in the step of roughening the surface of the ceramic substrate which is performed as a pre-treatment prior to Cu electroless plating. However, the ceramic substrate used in the present invention can be subjected to a surface-roughening treatment using a weaker alkaline or acidic solution and the Ag base conductor has a high resistance to corrosion attack of alkali or acid. Therefore, ceramic substrate of the present invention can be surface-roughened without causing any trouble and is subjected to the foregoing plating.

Figure 1:
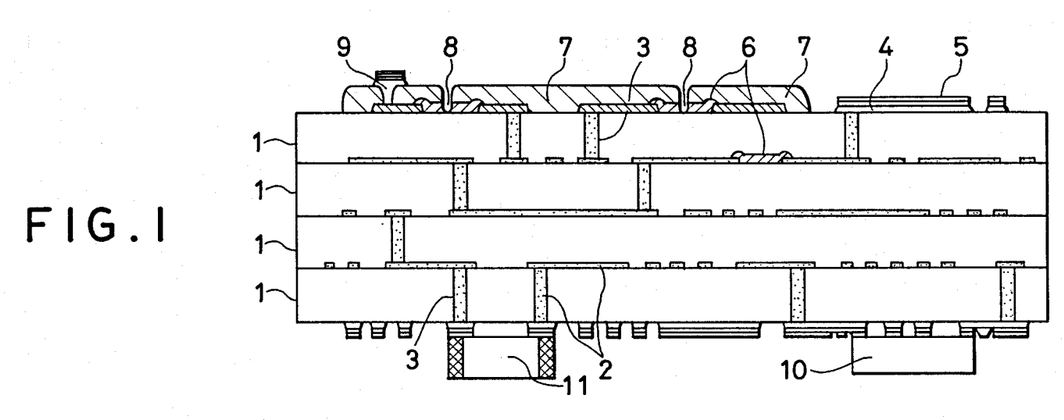
FIG. 1 is a schematic view illustrating the structure of a multilayer substrate according to the present invention.

FIG. 1 is a schematic view illustrating the structure of a multilayer substrate according to the present invention. In this figure, reference numeral 1 designates a ceramic insulator layer prepared from a green ceramic sheet and the multilayer substrate is made up of four layers. Reference numeral 2 is a Ag internal conductor and through holes 3 are filled with this Ag internal conductors 2 to form a internally connected circuit. Reference numerals 4 and 5 represent a Cu conductor formed onto the external surface of the multilayer substrate and solder, respectively. Reference numeral 6 represents resistors and the external one is covered with an overcoat 7 and has a laser trimmed portion 8. Reference numerals 9, 10 and 11 are a via hole, a silicon chip and a passive element, respectively.

The present invention will now be described in detail with reference to the following Examples. Parts and percentages specified in the Examples are all by weight, unless otherwise indicated.

EXAMPLE 1

A ceramic insulator mixed powder consisting of 60% of glass powder consisting of 18.2% of CaO 18.2% of $Al_2O_3$, 54.5% of $SiO_2$ and 9.1% of $B_2O_3$ which was prepared by melting a glass-forming material at 1450° C., quenching in water and grinding to an average particle size of 3 to 3.5 $\mu$m; and 40% of alumina powder having an average particle size of 1.2 $\mu$m was prepared and, then, solvent (e.g. toluene, xylene or alcohols), binder (acrylic resin) and plasticizer (dioctyl phthalate) were added to the mixture. The resulting mixture was fully blended to obtain a slurry having a viscosity of 2000 to 40000 cps and was cast into a green sheet, 0.4 mm in thickness, by conventional doctor blading techniques.

Figure 2:
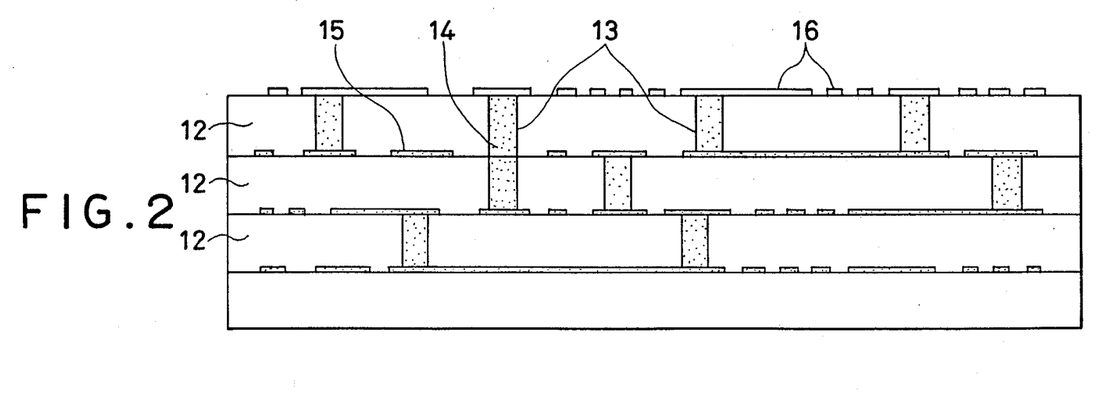
FIG. 2 is a schematic view illustrating one embodiment according to the present invention.

Thereafter, as shown in FIG. 2, the green sheet 12 obtained above was cut into dimensions of 30 mm×30 mm and through holes 13 with a diameter of 0.3 mm were formed. The through holes 13 were filled with a Ag conductive paste 14, which was prepared by adding binder (ethyl cellulose) and solvent (terpineol) to Ag powder and, then, thoroughly mixing, and an internal Ag conductor pattern 15 was printed using the same Ag conductive paste.

Twelve green sheets with the conductor patterns printed as set forth were stacked and hot pressed at 100° C. and 100 kg/cm$_2$ to obtain a monolithic green ceramic body. The obtained body was fired at a temperature of 900° C. for 20 minutes in an oxidizing atmosphere in an electric continuous belt furnace usually used. The fired Ag electrodes possessed a low sheet resistivity of 2.4 milliohms/square.

A Cu external conductor pattern 16 was printed onto the external surface of the multilayer substrate thus obtained, using a Cu base conductive paste 6001 commercially available from E.I. Du Pont Nemours Co. and electrically connected with the Ag internal conductors through the through holes 13.

After printing the copper conductor pattern 16, the pattern was fired at 600° C. over a period of ten minutes in a nitrogen ($N_2$) atmosphere in an electric continuous belt furnace usually used. No particles which may be resulted from the formation of liquid phase at the interface between the copper conductors and the Ag conductor in the through holes have not been detected and blisters and bubbles have not been observed. The copper conductor had a low sheet resistivity of the order of 2.5 milliohms/square.

Figure 3:
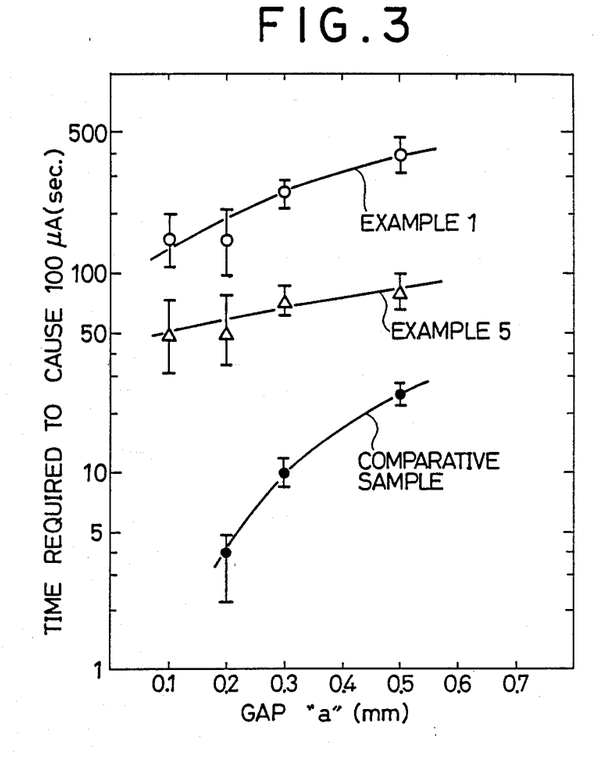
FIG. 3 is a graph showing the results for migration test.
Figure 4:
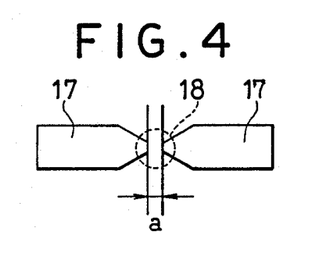
FIG. 4 is a plane view of a test sample for the migration test.

The conductor was evaluated for migration properties and the results is shown in FIG. 3. The evaluation was conducted for a test sample fabricated in the same as in the foregoing Example in which Cu conductors 17 having the shape as shown in FIG. 4 were arranged with a gap "a". In this evaluation, a water droplet 18 was dropped at the gap and a direct current voltage of 5 V was applied between the two spaced conductors 17. FIG. 3 is a graph showing the relationship between the length of time required to cause a current of 100 $\mu$A in the gap "a" between the conductors 17 through the water droplet and the width of the gap "a". The same evaluation was made for a comparative sample having two-spaced conductors which were formed onto an alumina substrate by conventional thick film techniques using a commercially available Ag-Pd conductive paste and the results were shown in the same figure for the purpose of comparison.

As can be seen from FIG. 3, the test sample of the present invention required a very long time till the current of 100 μA occurred and it has been found to be superior in anti-migration property over the comparative sample. Further, the foregoing test samples were tested for their solder-leach resistance by repeating a cycle of immersion in a molten eutectic solder (Pb : Sn=6:4) for five seconds and it has been found that the Cu conductors of the present invention was not subjected to any deformation at their periphery due to solder leaching even after ten times of repetition of the immersion. Whereas, in the comparative sample, a considerable solder leaching was observed after five times of repetition and the periphery of the conductors was deformed.

The glass used in the foregoing Example was reacted with alumina powder during firing and partially crystallized. In order to cause stably this partial crystallization, $ZrO_2$ or $TiO_2$ was added in an amount of 2 wt.% to the glass and the same procedure at set forth in the above Example 1 was repeated. The similar test results as in Example 1 were obtained.

EXAMPLE 2

50% of glass powder obtained by pulverizing a commercially available alumino-lead borosilicate glass ($PbO-Al_2O_3-SiO_2-B_2O_3$ system) to an average particle size of 3 to 3.5 μm was mixed with 50 % of alumina powder having an average particle size of 1.2 μm to formulate a powdered ceramic insulator mixture and green sheets having a thickness of 0.4 mm were prepared in the same way as described in Example 1, using the insulator ceramic mixture. Chemical analysis has indicated that the used alumino-lead borosilicate glass consists of 56% of $SiO_2$, 10% of $Al_2O_3$, 16% of PbO, 8% of CaO, 4% of alkali metal oxide and 6% of other components.

Binder (ethyl cellulose) and solvent (terpineol) were added to Ag-Pt alloy powder consisting of 99% of Ag and 1% of Pt and thoroughly mixed to formulate a conductive paste for internal conductors. A multilayer structure body with conductor patterns was obtained in the same manner as described in Example 1, using the green sheets previously described and the conductive paste and then fired at 900° C. for 20 minutes in a covential electric continuous belt furnace in an oxidizing atmosphere.

The fired Ag-Pt conductor had a sheet resistivity of 2.2 milliohms/square.

External conductors were formed on the surface of the multilayer substrate thus obtained, in the same way as in Example 1, using the copper conductive paste 6001 manufactured by E.I. Du Pont de Nemours Co. There is no indication of the formation of liquid phase at the interface between the Cu external conductor and the AgPt conductor in the through hole portion and neither bubbles nor blisters occurred. The Cu conductors had a sheet resistivity of 2.4 milliohms/square and was superior in anti-migration and solder-leach resistance properties to the Ag-Pd external conductors.

EXAMPLE 3

Figure 5:
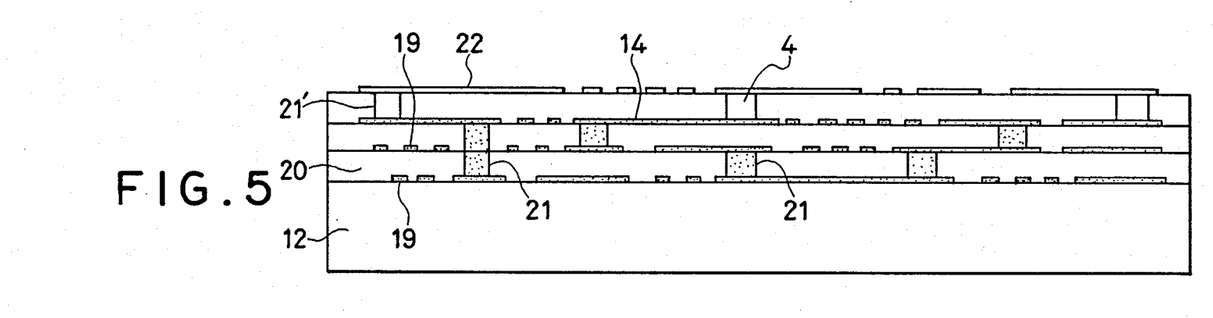
FIG. 5, FIG. 6 and FIG. 7 are schematic views illustrating further embodiments according to the present invention.

A ceramic insulator mixed powder consisting of 60% of glass consisting of 27.3% of CaO, 4.5% $Al_2O_3$, 59.1% of $SiO_2$ and 9.1% of $B_2O_3$ which was prepared by melting the glass-forming material, quenching in water and pulverizing to an average particle size of 3 to 3.5 μm; and 40% of alumina powder having an average particle size of 1.2 μm was prepared and using the mixture, a 1.0 mm thick green sheet was made in the same manner as set forth in Example 1. As shown in FIG. 5, the green ceramic sheet 12 was cut into dimensions of 3 cm×3 cm and a Ag-Pd conductor pattern 19 was printed onto the surface of the green sheet, using a conductive paste which was prepared by adding binder (ethyl cellulose) and solvent (terpineol) to a powder mixture of 90% of Ag and 10% of Pd and fully mixing together.

Thereafter, an insulator paste which was prepared by adding binder (ethyl cellulose) and solvent (terpineol) to the insulator mixed powder specified above and, then, fully mixing was printed onto the green ceramic sheet 12 with the printed conductor pattern 19 to form an insulator layer 20 and, then, the Ag-Pd pattern 19 was printed onto the insulator layer 20, as set forth above.

An electrical connection between the interlayered conductor layers was achieved by filling via holes 21 punched into the insulator layers with the Ag-Pd conductor.

The above layering operations were repeated to form a multilayer interconnected structure. In this stage, via holes 21' were left empty and, after firing the multilayered structure in an oxidizing atmosphere, were filled with a Cu conductor 4, as set forth below. The multilayered structure was fired at 900° C. for 20 minutes in an oxidizing atmosphere in an electric belt furnace customarily used. The fired Ag-Pd conductor had a sheet resistivity of 10 milliohms/square.

A Cu conductive paste was prepared by adding binder (ethyl cellulose) and solvent (terpineol) to a powder mixture consisting of 100 parts by weight of Cu powder with an average particle size of 0.5 μm and five parts of $PbO-SiO_2-B_2O_3$ system glass powder and thoroughly mixing them and was extruded into the via holes 21' to form the Cu conductor 4. Subsequently, using the same Cu conductive paste, a Cu conductor pattern 22 was printed onto the surface of the multilayer substrate. In such an arrangement, the Cu conductor pattern was electrically interconnected through the Cu conductor 4 filled in via holes 21' with the Ag-Pd internal conductors.

Thereafter, the substrate was fired at 750° C. for 10 minutes in a $N_2$ atmosphere in an electric belt furnace usually used. The fired Cu conductors had a low sheet resistivity of 2.4 milliohms/square and was, like the Cu conductor in Example 1, superior in anti-migration and solder-leach resistance properties as compared to the Ag-Pd external conductors. Further, formation of liquid phase was not observed at the interface between the interlayered Ag-Pd conductor and the Cu conductors filled in the via holes and any blister or bubble did not occur.

In the glass used the foregoing Example 3, $Cr_2O_3$, $Fe_2O_3$ or MnO was added in an amount of 2% as a coloring agent and the same procedure was repeated to further multilayer substrate of the present invention. Similar test results were obtained.

EXAMPLE 4

Figure 6:
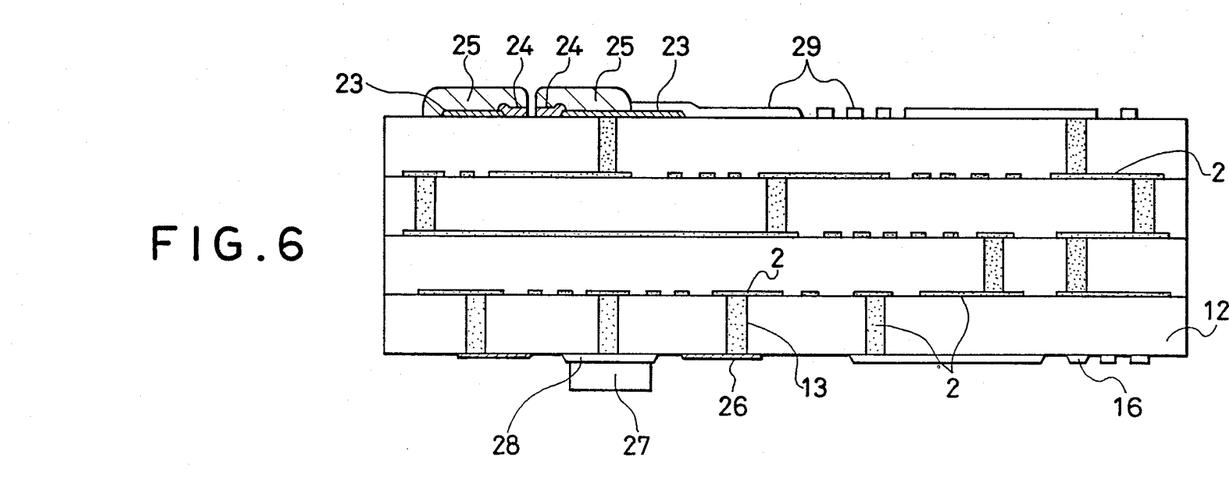

The same procedure described in Example 1 was repeated to obtain a multilayer substrate body containing Ag internal conductors 2, as shown in FIG. 6. Electrodes 23 for a resistor were printed onto the top surface of the body, using a conductive paste which was prepared by adding binder (ethyl cellulose) and solvent (terpineol) to a powder mixture of 80% of Ag and 20% Pd and thoroughly mixing together, and, then, a $RuO_2$ resistor paste 24 was printed between the two spaced electrodes 23. The RuO$_2$ resistor paste 24 was prepared by adding binder (ethyl cellulose) and solvent (terpineol) to a powdered mixture consisting of 25 parts of RuO$_2$ powder and a powdered ceramic insulator mixture composed of 60 parts of glass powder and 15 parts of alumina powder and fully mixing.

An overcoat layer 25 was then printed onto the resistor thus formed, using an overcoat paste which was prepared by adding binder (ethyl cellulose) and solvent (terpineol) to the foregoing powdered ceramic insulator mixture and thoroughly mixing together. Prior to hot pressing the stacked green sheets, an electrode 26 for wire-bonding used when packaging a silicon chip 27 was printed on another external surface opposite to the external surface having the resistor, using the aforesaid Ag-Pd conductive paste.

The electrode 26 was connected through the conductor filled in the through hole 13 with the internal conductors. Then, the multilayer substrate assembly was fired at 900° C. for 20 minutes in an oxidizing atmosphere in an electric belt furnace customarily used. After the firing operation, wiring 29 for electrical connection between the resistor and the circuit pattern and wiring for signal lines were printed onto the external surface having the resistor, using the Cu paste 6001 manufactured by E.I. Du Pont Nemours Co., and fired at 600° C. for ten minutes in a nitrogen (N$_2$) atmosphere in a conventional electric belt furnace. After firing, an electrode 28 for electrical interconnection of the silicon chip 27 and wiring for signal lines were printed onto the external surface with the resistor and the opposite external surface, using the Cu paste 6001 commercially available from E.I. Du Pont Nemours Co., and fired under the same conditions as set forth above.

After firing, the resistance of the resistor was precisely adjusted by laser-trimming through the overcoat which had a thickness of about 10 μm.

The resulted resistor had a sheet resistivity of 1 kiloohms/square. The sheet resistivity of the resistor could be varied within the range of 10 ohms/square to 1 megohms/square by varying the mixing ratio of RuO$_2$ powder, glass powder and alumina powder and the TCR (temperature coefficient of resistance) was within ±200 ppm/° C.

EXAMPLE 5

A further multilayer substrate with internal conductors and resistors was obtained in the same procedure as set forth in Example 4 except that the AgPd conductors used in Example 3 were used as the internal conductors and no electrode for wire-bonding of Si chip was formed.

Figure 7:
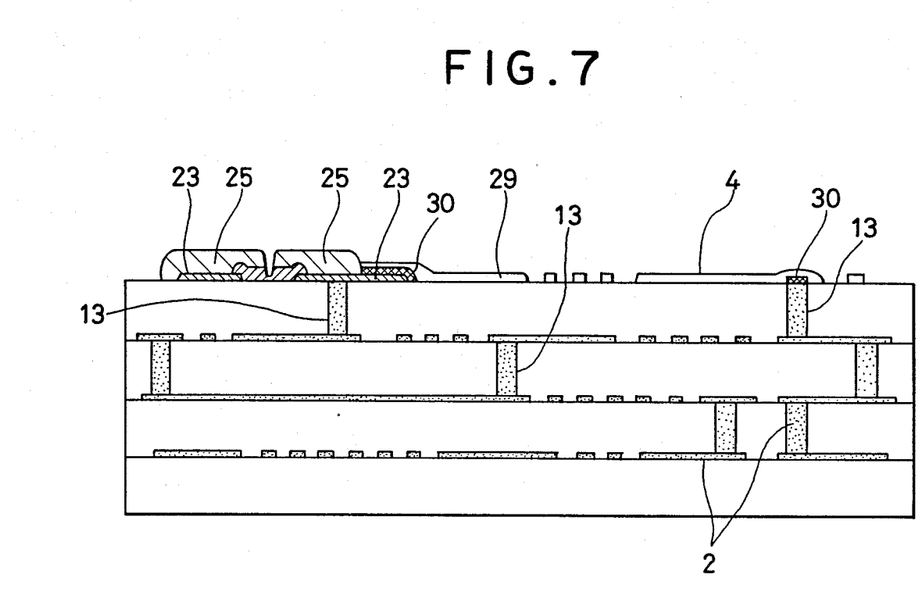
Figure 8:
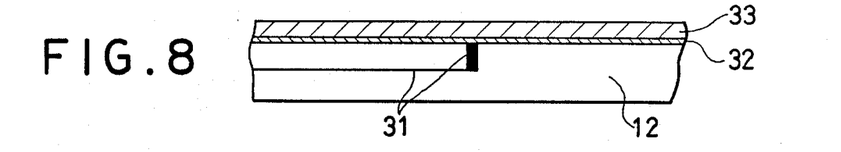
FIG. 8 to FIG. 11 are schematic views illustrating the successive steps for forming a Cu conductor pattern by plating process.

After firing the substrate in an oxidizing atmosphere, nickel metal layer 30 was, as shown in FIG. 7, electrolessly deposited onto an exposed surface portion of the 90% Ag-10% Pd conductors and an exposed portion, extending from the overcoat 25, of the 80% Ag 20% Pd electrodes 23 for the resister. Similarly, Cu was deposited onto the nickel metal.

After the electroless plating operations, wires 29 to connect the resistor with the circuit and wire for signal lines were printed, using a Cu conductive paste 9153 commercially available from E.I. Du Pont Nemours Co. and then fired in a nitrogen (N$_2$) atmosphere at 900° C. for a period of ten minutes, using an electric belt furnace ordinary used.

After the firing operation, there was no indication of formation of liquid phase at the interfaces between the Cu conductor and the Ni layer and between the Ni layer and the internal conductors. Further, no blister or bubble was found. The sheet resistivity of the resistor was in the range of 10 ohms/square to 1 megohms/square and the TCR was within ±200 ppm/° C. The Cu external conductors had a low sheet resistivity of the order of 1.8 milliohms/square and were superior in antimigration properties to the comparative conductors, as indicated in FIG. 3. Further, in solder-leach resistance test, the Cu external conductors of the present invention were immersed in the aforedescribed eutectic solder maintained at 260° C. over a period of five seconds and the immersion cycle was repeated ten times. No solder leaching was observed after the ten cycles.

EXAMPLE 6

A 0.3 mm thick green sheet was prepared in the same way as set forth in Example 1, using a ceramic insulator powder mixture which was made up of 50% of glass powder consisting of 80% of SiO$_2$, 12% of B$_2$O$_3$ and the remainder being of alkali metal oxide, alkaline earth metal oxide, etc., and having an average particle size of 2 μm; 30% of alumina powder having an average particle size of 5 μm; and 20% of chromium oxide having an average size of 4 μm. The green ceramic sheet 12 was cut into a 3 cm×3 cm sheets and a Ag-Pd type conductor pattern was printed onto the green sheet 12, using a conductive paste which was formulated, as set forth in Example 3, by adding binder (ethyl cellulose) and solvent (terpineol) to a powder mixture consisting of 90% of Ag and 10% Pd and intimately mixed together.

After printing a conductor pattern in the same manner as set forth above, the green sheets with the printed conductor pattern were stacked, hot pressed at 100° C. and at 100 kg/cm$^2$ to form a monolithic multilayered structure and then fired at 950° C. for 60 minutes in an oxidizing atmosphere in an electric continuous belt furnace ordinarily used. The fired internal Ag-Pd conductor had a low sheet resistivity of 10 milliohms/square.

Figure 9:
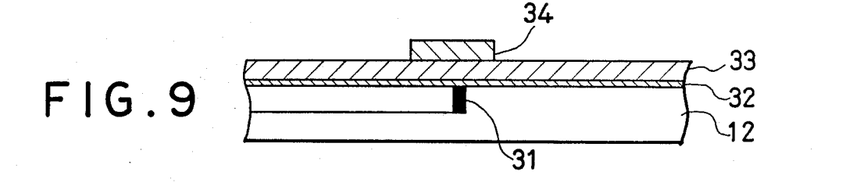
Figure 10:
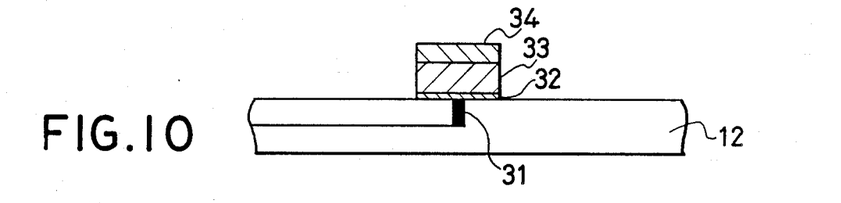
Figure 11:
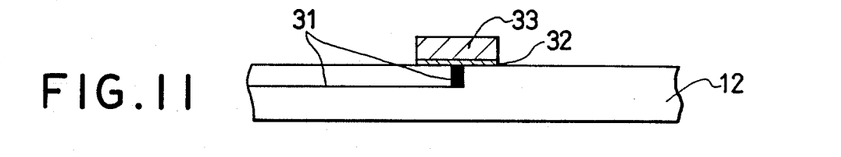

Thereafter, a Cu conductor pattern was formed onto the surface of the fired multilayer substrate by successive steps as shown in FIG. 8 to FIG. 11. The surface of the fired multilayer substrate having the Ag-Pd conductor 31 was roughened by means of etching with alkaline aqueous solution. Thereafter, the substrate was subjected to electroless plating operation to deposit a 1 μm thick Cu coating 32 in the presence of activator and then to electro-plating operation to deposit a 9 μm thick coating 33. As illustrated in FIG. 9, a resist pattern 34 which was later used to protect pattern regions was formed on the Cu coating 33 by photolithography techniques and the Cu coating in other regions than the pattern regions was removed by etching treatment (FIG. 10). The resist was removed, as shown in FIG. 11 and the desired Cu conductor pattern was obtained.

In the resulting conductor pattern, the minimum line width and the narrowest spacing between lines were both on the order of 50 μm and any short circuit was not caused. The sheet resistivity was 2.0 milliohms/square. The Cu conductor exhibited a good solderability to a 60% Sn-40% Pb eutectic solder. Further, after the Cu external conductor was subjected to soldering operation, the peel strength of the soldered conductor was measured using a copper wire with a diameter of 0.6 mm and the measurements indicated good results, i.e. an initial peel strength of 2.6 kg/2 mm□ and a peel strength of 2.9 kg/2 mm□ after aging at 150° C. for 168 hours. The Cu external conductor also had good anti-migration property well comparable with that of a fired Cu conductor formed by thick film techniques. Further, the Cu conductor pattern achieved a good interconnection with the interlayered Ag-Pd conductor and no detrimental change was observed from the temperature cycling test of 100 cycles of exposure at 150° C., room temperature and −40° C.

EXAMPLE 7

Using glass powder of $MgO-SiO_2-Al_2O_3-B_2O_3-ZrO_2-TiO_2$ as ceramic insulator system having an average particle size of 2 $\mu$m, 0.3 mm thick green sheets were prepared in the same way as described in Example 1 and a body with a multilayered circuit structure was fabricated in the same procedure as in Example 6. The multilayered body was fired at 950° C. for 2 hours in an oxidizing atmosphere. The fired ceramic was found to be a crystallized glass having a crystallized phase of cordierite and the fired Ag-Pd conductor had a sheet resistivity of 9.6 milliohms/square.

Using the Cu conductive paste 6001 commercially available from E.I. Du Pont Nemours Co., external conductors were formed onto the surface of the substrate obtained above in the same manner as in Example 1. There was no indication of formation of a liquid phase at the interface between the external Cu conductors and the Ag-pd conductors in the through holes and neither blistering nor bubbling occurred. The Cu conductors had a sheet resistivity of 2.3 milliohms/square and their anti-migration and solder-leach resistance properties were far superior over the comparative Ag-Pd conductors.

EXAMPLE 8

60% of glass powder consisting of 18.2% of CaO, 7.1% of BaO, 2% of MgO, 4.5% of $Al_2O_3$, 59.1% of $SiO_2$ and 9.1% of $B_2O_3$ which was prepared by melting the and glass-forming material, quenching in water and grinding to an average particle size of 2 $\mu$m and 40% of alumina powder having an average particle size of 2 $\mu$m were formulated into a ceramic insulator powder mixture and, using the mixture, a multilayered substrate body was fabricated in the same procedure as in Example 6. The firing temperature was 900° C.

Figure 12:
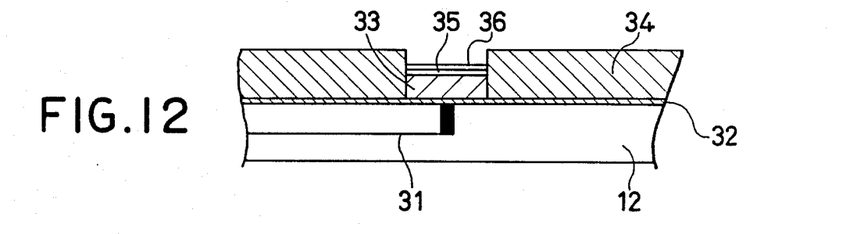
FIG. 12 is a schematic view illustrating another embodiment of forming a Cu conductor pattern by plating process.

The surface of the multilayered substrate fired above were roughened by means of etching with an acidic aqueous solution. Thereafter, Cu electroless plating was performed in the presence of activator to provide a 0.5 $\mu$m thick Cu coating 32 onto the substrate 12 and then a resist pattern 34 was formed, as shown in FIG. 12. A Cu coating 33 with a thickness of about 10 $\mu$m was formed by electro-plating and further a 1 $\mu$m thick Ni coating 35 and a 1 $\mu$m thick Au coating 36 were subsequently provided by electro-plating process.

The resist was removed and the Cu coating 32, which was deposited under the resist by the foregoing electroless plating, was removed by etching.

In the resulting conductor pattern, the minimum line width and the narrowest spacing between lines were both on the order of 50 $\mu$m and the sheet resistivity was 1.9 milliohms/square. The conductor pattern exhibited a good solderability to a 60% Sn-40% Pb eutectic solder. Further, after the conductor pattern was subjected to soldering operation, the peel strength of the soldered conductor pattern was measured using a copper wire with a diameter of 0.6 mm and the measurements indicated good results, i.e. an initial peel strength of 2.6 kg/2 mm☐ and a peel strength of 2.9 kg/2 mm☐ after aging at 150° C. for 168 hours. The conductor pattern also had good anti-migration property and achieved a good interconnection with the interlayered Ag-Pd conductor. No detrimental change was observed from the temperature cycling test of 100 cycles of exposure at 150° C., room temperature and −40° C.

As described above, according to the present invention, there can be provided a multilayer substrate having external Cu conductors which are characterized by a low resistance, an excellent anti-migration property and high solder-leach resistance, and internal Ag conductors co-fired with green ceramic sheets at low firing temperature in an oxidizing atmosphere. Further high reliable resistors of $RuO_2$ or $Bi_2Ru_2O_7$ type may be integrally formed onto and/or inside the substrate. In such an arrangement, problems or difficulties caused due to Ag migration, incomplete binder removal, solder leaching, etc., are eliminated and high reliable and high pattern precision multilayer substrate can be obtained.

What is claimed is:

1. In a multilayer ceramic substrate comprising ceramic electrical insulating layers having internal electrical conductors between said layers and external electrical conductor means electrically connected with said internal electrical conductors, said conductors forming multiplayered circuit patterns, the improvement which comprises: said internal electricla conductors are formed of an Ag or Ag alloy, electrically conductive material capable of being co-fired with multilayered green ceramic substrate sheets in an oxidizing atmosphere and said external electrical conductor means are formed of a Cu or Cu alloy, electrically conductive material, said external electrical conductor means being formed in such a way that a liquid phase of Cu-Ag is not formed at the interface of said external electrical conductor means with a said internal electrical conductor.

2. A multilayer ceramic substrate as claimed in claim I in which said external electrical conductor means is formed by firing at a temperature below the eutectic melting point of a eutectic of said external electrical conductor means and said internal electrical conductor.

3. A multilayer ceramic substrate as claimed in claim 1 in which, when firing said external electrical conductor means, a metallic layer different from said external electrical conductor means and said internal electrical conductor is interposed between each interface of these two kinds of conductors.

4. A multilayer ceramic substrate as claimed in claim I in which said external electrical conductor means are formed by a plating process.

5. A multilayer cermaic circuit board made of a plurality of units which are laminated on one another and fired to form a unitary fired body, each of said units including a ceramic electrical insulating layer and a patterned electrical conductor layer supported on said ceramic electrical insulating layer, through-hole electrical conductors extending through the ceramic electrical insulating layers and connecting the patterned electrical conductor layers of the respective units to form a predetermined internal wiring circuit in said unitary fired body, both said patterned electrical conductor layers and said electrical coductors consisting essentially of a first electrical conductor material selected form the group consisting of Ag and electrically conductive Ag alloys, said fired body being the results of co-firing a laminate of green ceramic sheets having said patterned electrical conductor layers and said electrical conductors of said first material applied thereon in an oxidizing atmosphere to convert said first material into said internal wiring circuit and to convert said sheets into said unitary fired body, said circuit board also including a predetermined surface of said unitary fired body and in electrical connection with said internal wiring circuit at least one interface therebetween, said external wiring pattern consisting esentially of a second electrical conductor material selected from the group consisting of Cu and electrically conductive Cu alloys, said external wiring pattern being the result of applying said second material in the form of said external wiring pattern on said unitary fired body and then firing said second composition in a neutral or reducing atmosphere at a temperature below the eutectic temperature of a eutectic alloy of said first and second materials so that a liquid phase of said euctectic alloy is not formed at said interface of said internal wiring circuit and said external wiring pattern.

6. A multilayer ceramic board as claimed in claim 5 in which said electrically conductie Ag alloys of Ag with Pd, Pt or both of Pd and Pt, and said electrically conductive Cu alloys are alloys of Cu with Pd, Pt or both of Pd and Pt.

7. A multilayer ceramic circuit board as claimed in claim 6 in which said external wiring pattern has a resistivity of from 1.5 to 3 milliohms per square.

8. A multilayer ceramic circuit board made of a plurality of units which are lamianated on one another and fired to form a unitary fired body, each of said units including a ceramic electrical insulating layer and a patterned electrical conductor layer supported on said ceramic electrical insulating layer, through-hole electrical conductors extending through the ceramic electrical insulating layers and connecting the patterned electrical conductor layers of the respective units to form a predetermined internal wiring circuit in said unitary fired body, both said patterned electrical conductor layers and said electrical conductors consisting essentially of a first electrical conductor material selected from the group consisting of Ag and electrically conductive Ag alloys, said fired body being the result of co-firing a laminate of green ceramic sheets having said patterned electrical conductor layers and said electrical conductors of said first material applied thereon in an oxidizing atmosphere to convert said first material into said internal wiring circuit and to convert said sheets into said unitary fired body, said circuit board also including a predetermined external wiring pattern applied on at least one external surface of said unitary fired body, metal layer means interposed between said external wiring pattern and said internal wiring circuit and providing electrical connection means therebetween, said external wiring pattern consisting essentially of a second electrical conductor material selected from the group consisting of Cu and electrically conductive Cu alloys, said external wiring pattern being the result of applying said second material in the form of said external wiring pattern on said unitary fired body, placing said metal layer means between adjacent portions of said external wiring pattern and said internal wiring circuit and firing said second material in a neutral or reducing atmosphere at a temperature below the eutectic temperatures of eutectic alloys of said metal layer means with said first and second materials so that a liquid phase of a eutectic alloy is not formed at the interfaces of said metal layer means with said internal wiring circuit and said external wiring pattern.

9. A multilayer ceramic circuit board as claimed in claim 8 in which said metal layer is made of a metal selected from the group consisting of Ni, Cr, Ti and Pd.

10. A multilayer ceramic board as claimed in claim 8 in which said electrically conductie Ag alloys are alloys of Ag with Pd, Pt or both of Pd and Pt, and said electrically conductive Cu alloys are alloys of Cu with Pd, Pt or both of Pd and Pt.

11. A multiplayer ceramic circuit board as claimed in claim 10 in which said external wiring pattern has a resistivity of from 1.5 to 3 milliohms per square.

12. A multilayer ceramic circuit board made of a plurality of units which are laminated on one another and fired to form a unitary fired body, each of said units including a ceramic electrical insulating layer and a patterned electrical conductor layer supported on said ceramic electrical insulating layer, through-hole electrical conductors extending through the ceramic electrical insulating layers and connecting the patterned electrical conductor layers of the respective units to form a predetermined internal wiring circuit in said unitary fired body, both said patterned electrical conductor layers and said electrical conductors consisting essentially of a first electrical conductor material selected from the group consisting of Ag and electrically conductive Ag alloys, said fired body being the result of co-firing a laminate of green ceramic sheets having said patterned electrical conductor layers and said electrical conductors of said first material applied thereon in an oxidizing atmosphere to convert said first material into said internal wiring circuit and to convert said sheets into said unitary fired body, said circuit board also including a predetermined external wiring pattern plated on at least one external surface of said unitary fired body and in electrical connection with said internal wiring circuit at at least one interface therebetween, said external wiring pattern consisting essentially of a second electrical conductor material selected from the group consisting of Cu and electrically conductive Cu alloys, said external wiring pattern being the result of electroless plating said second material in the shape of said wiring pattern on said unitary fired body.

13. A multilayer ceramic circuit board as claimed in claim 12 in which said electrically conductive Ag alloys are alloys of AG with Pd, Pt or both of Pd and Pt, and said electrically conductive Cu alloys are alloys of Cu with Pd, Pt or both of Pd and Pt.

14. A multilayer ceramic circuit board as claimed in claim 14 in which said external wiring pattern has a resistivity of from 1.5 to 3 milliohms per square.

* * * * *

UNITED STATES PATENT AND TRADEMARK OFFICE
CERTIFICATE OF CORRECTION

PATENT NO. : 4 795 670
DATED : January 3, 1989
INVENTOR(S) : Susumu NISHIGAKI et al It is certified that error appears in the above-identified patent and that said Letters Patent is hereby corrected as shown below:

Column 12, line 27; change "multiplayered" to ---multilayered---.
line 28; change "electricla" to ---electrical---.
line 52; change "cermaic" to ---ceramic---.
line 63; change "coductors" to ---conductors---.
line 64; change "form" to ---from---.
line 66; change "results" to ---result---.
Column 13, line 5; after "predetermined" insert ---external wiring pattern applied on at least one external---.
line 6; after "at" insert ---at---.
line 8; change "esentially" to ---essentially---.
line 20; after "ceramic" insert ---circuit---.
line 21; change "conductie" to ---conductive---.
after "alloys" insert ---are alloys---.
Column 14, line 13; change "conductie" to ---conductive---.
line 17; change "multiplayer" to ---multilayer---.

UNITED STATES PATENT AND TRADEMARK OFFICE
CERTIFICATE OF CORRECTION

PATENT NO. : 4,795,670

DATED : January 3, 1989

INVENTOR(S) : Susumu NISHIGAKI et al

Page 2 of 2

It is certified that error appears in the above-identified patent and that said Letters Patent is hereby corrected as shown below:

Column 14, line 54; change "AG" to ---Ag---.

line 58; change "14" to ---13---.

Signed and Sealed this

Fifteenth Day of August, 1989

Attest:

DONALD J. QUIGG

Attesting Officer

Commissioner of Patents and Trademarks